United States Patent [19]

Kajihara et al.

[11] Patent Number: 4,981,560
[45] Date of Patent: Jan. 1, 1991

[54] METHOD OF SURFACE TREATMENT OF COPPER FOIL OR A COPPER CLAD LAMINATE FOR INTERNAL LAYER

[75] Inventors: Toshiyuki Kajihara; Katsuhito Fukuda; Masato Takami, all of Kyoto, Japan

[73] Assignee: Fukuda Metal Foil & Powder Industrial Co., Ltd., Japan

[21] Appl. No.: 327,552

[22] Filed: Mar. 23, 1989

[30] Foreign Application Priority Data

Mar. 25, 1988 [JP] Japan .................................. 63-72706

[51] Int. Cl.$^5$ .......................... C25D 3/38; C25D 7/06
[52] U.S. Cl. ..................................... 204/27; 204/52.1
[58] Field of Search ................................. 204/27, 52.1

[56] References Cited

FOREIGN PATENT DOCUMENTS 55-29128  3/1980  Japan .
55-30818  3/1980  Japan .
60-133794 7/1985  Japan .
60-143689 7/1985  Japan .
61-13400  4/1986  Japan .

*Primary Examiner*—T. M. Tufariello
*Attorney, Agent, or Firm*—Lowe, Price, LeBlanc, Becker & Shur

[57] ABSTRACT

The surface of copper foil or a copper clad laminate for an internal layer is subjected to electrolysis in an aqueous solution containing diethylenetriamine pentacetic acid and copper ion by using the copper foil or a copper clad laminate for the internal layer as the cathode.

16 Claims, 2 Drawing Sheets

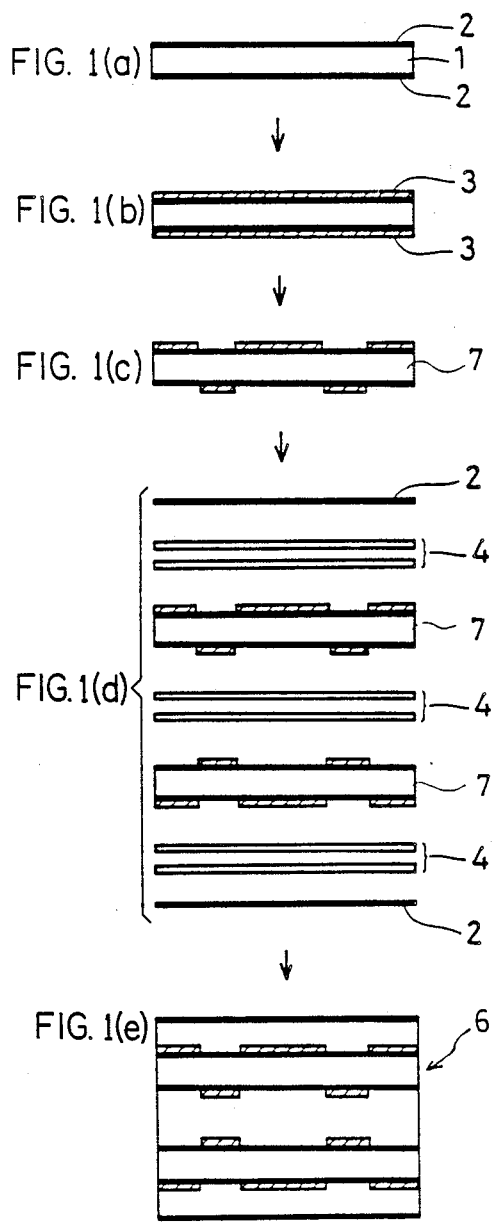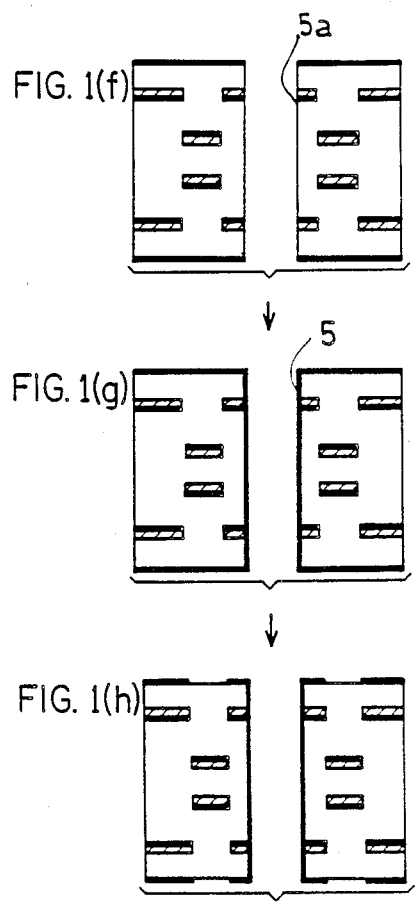

METHOD OF SURFACE TREATMENT OF COPPER FOIL OR A COPPER CLAD LAMINATE FOR INTERNAL LAYER

FIELD OF THE INVENTION

The present invention relates to surface treatment of copper treatment and particularly to a method for treating the copper surface of a copper clad laminate used as internal layer circuit in a multilayer printed circuit board and to a method for treating the surface of copper foil for printed circuit boards.

FIG. 1 shows a process for producing a multilayer printed circuit board. First, as shown in FIG. 1(a), a copper clad laminate is prepared by pressing copper foil (2) on both sides of a glass-fiber reinforced resin (for example epoxy-resin) (1). Next as shown in FIG. 1(b), a rough surface (3) is obtained by carrying out, a surface treatment that is subject matter of the invention, on a laminate lined with color lamintated as shown in FIG. 1(a). Then, as shown in FIG. 1(c), a conductor pattern for an internal layer is formed. The board (6) for the internal layer having the thus formed conductor pattern for the integral layer foil (2) to form a multilayer board is as shown in FIG. 1(d). Subsequently, as shown in FIG. 1(f), through holes 5a through through are bored, and through hole plating these holes 5a is formed in FIG. 1(g). Then, as shown in FIG. 1(h), a surface pattern is formed by etching.

In the internal layer materials for multilayer printed circuit boards, to improve the bondability of the copper surface of an internal layer circuit with bonding sheet resin prepregs for connecting the layers, a method wherein a rough surface composed of copper oxide is formed by immersing the surface into a high temperature bath of alkaline chlorite near the boiling point has generally been used, called a black-oxide (brown-oxide) treatment. For example, as shown in Japanese Patent Publication No. 61-13400, after making a copper surface rough chemically by an aqueous solution containing cupric chloride and hydrochloric acid in advance as a pretreatment, the surface is immersed into an aqueous solution containing ammonium acetate, cupric acetate, ammonium chloride and aqueous ammonia or an aqueous solution containing trisodium phosphate, sodium hydroxide and sodium chlorite; thereby an oxid film is chemically formed.

However, copper oxide film is poor is acid resistance, and particularly poor in hydrochloric acid resistance. When a high density multilayer board for surface mounting wherein a large number of through holes of small size or landless through holes is used is immersed into an aqueous solution containing hydrochloric acid for etch back after drilling through holes for multilayer board or for the activation pretreatment of an electroless copper plating process, the copper oxide film layer as a bonding surface between the resin and copper in the through hole is dissolved by corrosion. A so-called haloing pink ring phenomenon created, thereby causes problems such as poor bondability or delamination to occur.

To improve such defects, for example, a method wherein the chemical resistance of copper surface is improved by electrolytic reduction of copper oxide film prepared in advance Japanese Patent Publication No. 50-143689, and a method wherein copper oxide film is reduced by imidazole-type solution (Japanese Patent Publication No. 60-133794 were proposed.

However, in any method, the above reducing treatment was required to be conducted after the usual black-oxide treatment at a high working treatment near the boiling point. Accordingly, these methods had defects in that many numbers of processes were necessary, leading to complexity. Also, a strict control of reduction was required, and the finished appearance and rough surface was not uniform.

The primary object of the invention is to provide a method of surface treatment having high acid resistance and sufficient peeling strength without black-oxide treatment as mentioned above. Further, the other objects of the invention are to provide a method of a surface treatment having few process steps, a short treatment time and not requiring any high temperature treatment.

SUMMARY OF THE INVENTION

In the invention, in treating copper to make a rough surface, for example, in a copper clad laminate for internal layer, the copper surface is immersed into aqueous diluted sulfuric acid solution to clean the surface after polishing and degreasing as a pretreatment. After rinsing, it is immersed into an aqueous solution containing diethylenetriamine pentaacetic acid and copper ion and electrolysis is conducted by using it as a cathode.

The bath contains diethylenetiamine pentaacetic acid as $10 \sim 300$ g/l of sodium diethylenetriamine pentaacetate (hereinafter described as DTPA.5Na), more preferably $40 \sim 100$ g/l, copper ion as $10 \sim 100$ g/l of cupric sulfate (5 $H_2O$ salt), more preferably $30 \sim 50$ g/l, and its PH is adjusted to $2.5 \sim 13.0$ by adding sulfuric acid, more preferably $3.5 \sim 7.0$. The weight ratio of DTPA.5-Na/cupric sulfate (5 $H_2O$ salt) is preferably $0.5 \sim 5.0$. The bath temperature is $30° \sim 60°$ C., more preferably $40° \sim 50°$ C. The current density is $2 \sim 10$ A/$dm^2$, the treatment time is $1 \sim 120$ seconds, showing $10 \sim 500$ A.sec/$dm^2$ as quantity of electricity, more preferably $30 \sim 100$ A.sec/$dm^2$. Below 10 A.sec/$dm^2$ in of electicity, the rough surface formed is extremely minute (below $0.02 \sim 0.03$ μm and difficult to obtain satisfactory peelstrength with resin. For electricity over 500 A.sec/$dm^2$, the bondability of rough surface itself is obtained, but the rough surface particle is larger (over $1.5 \sim 1.9$ μm), making it unfavorable when forming a fine pattern using a liquad resist. As the anode in electrolysis, copper is prefereably used.

Even if aminocarboxylic acids such as ethylenediamine tetraacetic acid having molecular structure similar to diethylenetriamine pentaacetic acid are used in place of diethylenetriamine pentaacetic acid, a rough surface good in bondability is not obtained.

After electrolytic treatment by the above-mentioned method, the rought surface is rinsed, dried, and the process for making the rough surface is finished. In case of long-term storage of the rough surface until the circuit pattern forming process, as the next process, or in the case of copper foil for printed circuit boards, the surface may be immersed in an aqueous solution containing benzotriazol and derivatives thereof to provide rust-resisting property by forming organic film on the surface. The surface may be subjected to general chromate treatment such as immersion into aqueous solution of bichromate.

Before peeling off etching resist after forming a circuit pattern, the copper surface of the circuit pattern on the thickness direction of copper clad laminate may be subject to soft etching by cupric chloride-hydrochloric acid to make the surface little rough; thereby the bondability of the surface with resin is elevated. The conditions of soft etching in this case are, for example, 20 g/l of cupric chloride ($2H_2O$ salt), 300 cc/l of concentrated hydrochloric acid, and at 25° C. of bath temperature the surface is subjected to immersion treatment for 30~60 seconds.

By the above-mentioned treatment, as shown in the photograph of FIG. 2, high density of the range of 0.1~0.2 μm in size is formed on the copper surface. Therefore, the printed circuit board using copper foil subjected to the above treatment has excellent acid resistance, generating no haloing pink-ring phenomenon and no lowering of peel strength of resin with copper foil. Further, the printed circuit board using copper foil subject to the above treatment has excellent heat resistance in soldering without lowering of adhesive strength of solder. The above treatment without high temperature treatment process is simple in working and few in process number, resulting in low costs. Thus, the invention has excellent features, contributing to the reliability of a high-multilayer printed circuit board requiring a precise pattern as well as general printed circuit plate.

BRIEF DESCRIPTION OF THE DRAWINGS

FIG. 1(a)~(h) is a typical section of the method for producing multilayer printed circuit plate according to the invention.

EXAMPLE

Example 1

Figure 2:
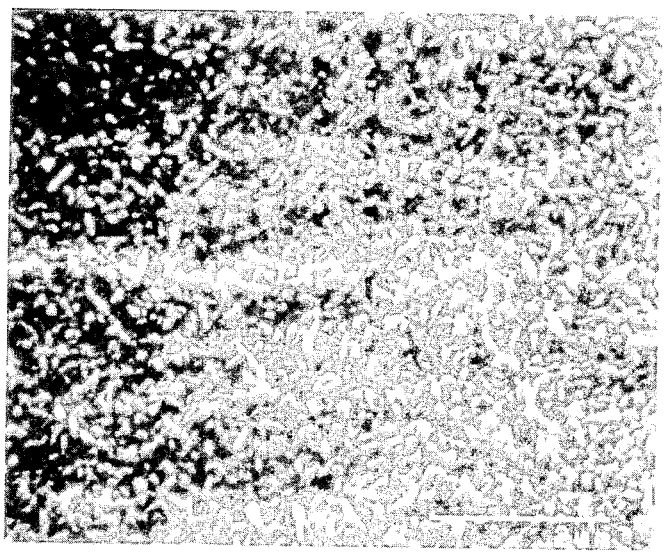
FIG. 2 is the electronic microscopic photograph (15000-fold) of fine copper rough surface obtained in Example 1 by the method according to the invention.

Glass-fiber reinforced epoxy-resin of FR-4 grade and electrolytic copper foil of 35 μm in thickness were laminated by pressing to obtain a double-sided board. After polishing the copper surface, it was immersed into aqueous 3% $H_2SO_4$ solution at room temperature for 20 seconds. Both sides rinsed were subjected to cathodic electrolysis in a bath of the following composition.
DTPA.5Na: 52 g/l
Cupric culfate (5 $H_2O$ salt): 45 g/l
PH (adjusted by sulfuric acid): 4.0
Bath temperature: 48° C.

A 4 $A/dm^2$ of current density for 15 seconds was applied. Both sides were rinsed and dried. Then, bonding sheet prepregs were inserted between the both sides and external substrate (single-sided boards) and the secondary lamination was conducted to obtain a multilayer laminate (4 layers). The copper foil on the external layer was removed by etching to drill a hole of 0.8 mm in diameter and the laminate was immersed in 20 wt % hydrochloric acid for 1 hour, and then whether a haloing pink-ring was generated by soaking of hydrochloric acid into the internal surface was judged.

Separately, electrolytic copper foil of 35 μm in thickness was, after polishing the shiny side, immersed into aqueous 3% $H_2SO_4$ solution at room temperature for 20 seconds, rinsed, and subjected to cathodic electrolysis in the above-mentioned bath composition under the same conditions. After rinsing and drying, the thus obtained copper rough surface was observed under a scanning electronic microscope, and it was confirmed that the rough surface was composed of uniform fine particle-form of 0.1~0.2 μm in size. The copper foil was laminated with a subsarate of FR-4 grade to examine the peel strength, hydrochloric acid resistance and solder heat resistance. The results are shown in Table 2.

Example 2-10

Glass-fiber reinforced epoxy-resin of FR-4 grade and electrolytic copper foil of 35 μm in thickness were laminated by pressing to obtain a double-sided board. After polishing the copper surface, it was immersed into aqueouss 3% $H_2SO_4$ solution at room temperature for 20 seconds. The laminate rinsed was subjected to cathodic electrolysis in a similar manner as Example 1 under the both conditions as shown in Table 1 (PH adjusted by sulfuric acid). After rinsing and drying, bonding sheet prepreg was inserted between the both sides and external substrate (single-sided board) and the secondary lamination was conducted to obtain a multilayer laminate (4 layers). The copper foil on the external layer was removed by etching to drill a hole of 0.8 mm in diameter, and the laminate was immersed in 20 wt % hydrochloric acid for 1 hour, and then whether hydrochloric acid was soaked into the internal surface was judged. The results are shown in Table 2.

Separately, electolytic copper foil of 35 μm in thickness was, after polishing the shiny side, immersed into aqueous 3% $H_2SO_4$ solution at room temperature for 20 seconds, rinsed, and subjected to cathodic electrolysis under the bath composition and conditions shown in Table 1. After rinsing and drying, the copper foil was laminated with a substrate of FR-4 grade to examine the peel strength, hydrochloric acid resistance and solder heat resistance. The results are shown in Table 2. From the results, the copper rough surface according to the invention is excellent in hydrochloric acid resistance, showing no occurence of haloing pink-ring phenomenon and no lowering in peel strength after soldering, thereby the method for treating copper surface according to the invention is proved to be highly excellent treatment.

Example for Comparison 1

Glass-fiber reinforced epoxy-resin of FR-4 grade and electrolytic copper foil of 35 μm in thickness were laminated by pressing to obtain a double-sided board. After polishing the copper surface, it was immersed into aqueous 3% $H_2SO_4$ solution at room temperature for 20 seconds. The laminate rinsed was immersed into a bath for black-oxide treatment of the following composition for 60 seconds.
$NaCLO_2$: 60 g/l
$Na_3PO_4.12H_2O$: 10 g/l
NaOH: 12 g/l
Bath temperature: 98° C.

After rinsing and drying, bonding sheet prepregs were inserted between both sides and external substrate (single-sided boards) and it was laminated by heating to obtain a multilayer (4 layers). The copper foil on the external layer was removed by etching to drill a hole of 0.8 mm in diameter, and the laminate was immersed in 20 wt % hydrochloric acid for 1 hour, and then whether hydrochloric acid was soaked into the internal surface was judged. The results are shown in Table 2. As shown in the results, usual black-oxide treatment shows very poor hydrochloric resistance, generating haloing pink-ring phenomenon. Separately, electrolytic copper foil of 35 μm in thickness was, after polishing the glossy surface, immersed into aqueous 3% H$_2$SO$_4$ solution at room temperature for 20 seconds. After rinsing, the copper foil was immersed into the above-mentioned black-oxide treatment bath for 60 seconds. After rinsing and drying, the copper foil was laminated with a substrate of FR-4 grade to examine the peel strength, hydrochloric acid resistance and solder heat resistance. The results are shown in Table 2. Remarkable lowering of peel strength is shown after soldering, thereby peeling off of layers due to heat shock in soldering may occur, being unreliable and unsuitable for high density circuit.

Example for Comparison 2

Glass-fiber reinforced epoxy-resin of FR-4 grade and electrolytic copper foil of 35 μm in thickness were molded by pressing to obtain a a double-sided board. After polishing the copper surface, it was immersed into aqueous 3% H$_2$SO$_4$ solution at room temperature for 20 seconds. The laminate rinsed was immersed into a bath of the following composition for 30 seconds.
CaCl$_2$2H$_2$O: 30 g/l
HCl (36%): 300 cc/l
Bath temperature: 25° C.
The laminate rinsed was immersed into a bath for black-oxide treatment of the following composition for 60 secs.
NaClO$_2$: 80 g/l
Na$_3$PO$_4$.12H$_2$O: 10 g/l
NaOH: 8 g/l
Bath temperature: 94° C.

After rinsing and drying, bonding sheet pregregs were inserted between both sides and external substrate (single-sided boards) and it was laminated by heating to obtain a multilayer laminate (4 layers). The copper foil on the external layer was removed by etching to drill a hole of 0.8 mm in diameter, and the laminate was immersed into 20 wt % hydrochloric acid for 1 hour, and then whether hydrochloric acid was soaked into the internal layer surface was judged. The results are shown in Table 2.

Separately, electrolytic copper foil of 35 μm in thickness was, after polishing the shiny side, immersed into aqueous 3% H$_2$SO$_4$ solution at room temperature for 20 seconds. After rinsing, it was treated in a similar manner as above in the above-mentioned cupric chloride-hydrochloric acid bath. After rinsing, it was immersed into the above-mentioned black-oxide treatment bath for 60 seconds.

After rinsing and drying the copper foil was laminated into a laminate with a substrate of FR-4 grade to examine the peel strength, hydrochloric acid resistance and solder heat resistance. The results are shown in Table 2. The hydrochloric resistance is very poor also in this case, and the remarkable lowering of peel strength is also shown after immersion is solder, being proved to be unreliable.

TABLE 1

| Example NO. | DTPA.5Na (g/l) | CuSO$_4$.5H$_2$O (g/l) | PH | Temperature (°C.) | Current density (A/dm$^2$) | Electrolysis time (seconds) |
|---|---|---|---|---|---|---|
| 1 | 52 | 40 | 4.0 | 48 | 4.0 | 15 |
| 2 | 60 | 40 | 4.5 | 45 | 4.0 | 5 |
| 3 | 50 | 40 | 4.5 | 50 | 4.0 | 20 |
| 4 | 80 | 60 | 4.5 | 45 | 8.0 | 7 |
| 5 | 50 | 40 | 3.5 | 40 | 3.0 | 20 |
| 6 | 60 | 40 | 4.5 | 45 | 4.0 | 100 |
| 7 | 70 | 45 | 7.0 | 45 | 8.0 | 8 |
| 8 | 150 | 70 | 3.9 | 35 | 5.0 | 18 |
| 9 | 20 | 20 | 3.8 | 37 | 3.0 | 20 |
| 10 | 72 | 45 | 12.0 | 45 | 8.0 | 7 |

TABLE 2

| | Internal layer treatment Haloing pink-ring test *1 | Peeling off strength (Kg/cm) *2 | | |
|---|---|---|---|---|
| | | normal state | after immersion in hydrochloric acid (20 wt % HCl 25° C. 20 min.) | after immersion in solder (250° C. 20 sec. float) |
| Example | | | | |
| 1 | O | 1.27 | 1.25 | 1.24 |
| 2 | O | 1.12 | 1.10 | 1.10 |
| 3 | O | 1.30 | 1.30 | 1.28 |
| 4 | O | 1.08 | 1.05 | 1.03 |
| 5 | O | 1.10 | 1.07 | 1.04 |
| 6 | O | 1.20 | 1.17 | 1.17 |
| 7 | O | 1.11 | 1.10 | 1.11 |
| 8 | O | 1.21 | 1.20 | 1.18 |
| 9 | O | 1.12 | 1.12 | 1.10 |
| 10 | O | 1.14 | 1.12 | 1.12 |
| Example for comparison | | | | |
| 1 | X | 1.25 | 0.00 | 0.75 |
| 2 | X | 1.39 | 0.00 | 0.98 |

*1 O ... No soaking of hydrochloric acid X ... Large soaking depth (over 2 mm)
*2 Test at 1 mm only in width according to JIS-C-6481

We claim:
1. A method for the surface treatment of copper foil or a copper clad laminate for an internal layer, comprising a step of:
subjecting a copper foil or a copper clad laminate for an internal layer to cathodic electrolysis in an aqueous solution containing diethylenetriamine pentaacetic acid as 10–300 g/l of sodium diethylenetriamine pentaacetate and copper ions as 10–100 g/l of cupric sulfate at a pH of 2.5–13 and a temperature of 30°–60° C., and employing a current density of 10–500 A.sec/dm$^2$.

2. A method for the surface treatment of copper foil or a copper clad laminate for an internal layer as claimed in claim 1, wherein the said diethylenetriamine pentaacetic acid in the aqueous solution is sodium diethylenetriamine pentaacetate in an amount of 40–10 g/l.

3. A method for the surface treatment of copper foil or a copper clad laminate for an internal layer as claimed in claim 1, wherein the said copper ions in the aqueous solution are cupric sulfate in an amount of 30–50 g/l.

4. A method for the surface treatment of copper foil or a copper clad laminate for an internal layer as claimed in claim 1, wherein the said temperature is 40°–50° C.

5. A method for the surface treatment of copper foil or a copper clad laminate for an internal layer as claimed in claim 1, wherein the pH is 3.5-7.0.

6. A method for the surface treatment of copper foil or a copper clad laminate for an internal layer as claimed in claim 1, wherein the current density is 30-100 A.sec/dm2.

7. A method for the surface treatment of copper foil or a copper clad laminate for an internal layer as claimed in claim 2, wherein the said copper ions in the aqueous solution are cupric sulfate in an amount of 30-50 g/l.

8. A method for the surface treatment of copper foil or a copper clad laminate for an internal layer as claimed in claim 2, wherein the said temperature is 40°-50° C.

9. A method for the surface treatment of copper foil or a copper clad laminate for an internal layer as claimed in calim 3, wherein the said temperature is 40°-50° C.

10. A method for the surface treatment of copper foil or a copper clad laminate for an internal layer as claimed in claim 2, wherein the pH is 3.5-7.0.

11. A method for the surface treatment of copper foil or a copper clad laminate for an internal layer as claimed in claim 3, wherein the pH is 3.5-7.0.

12. A method for the surface treatment of copper foil or a copper clad laminate for an internal layer as claimed in claim 4, wherein the pH is 3.5-7.0.

13. A method for the surface treatment of copper foil or a copper clad laminate for an internal layer as claimed in claim 2, wherein the current density is 30-100 A.sec/dm2.

14. A method for the surface treatment of copper foil or a copper clad laminate for an internal layer as claimed in claim 3, wherein the current density is 30-100 A.sec/dm2.

15. A method for the surface treatment of copper foil or a copper clad laminate for an internal as claimed in claim 4, wherein the current density is 30-100 A.sec/dm2.

16. A method for the surface treatment of copper foil or a copper clad laminate for an internal layer as claimed in claim 5, wherein the current density is 30-100 A.sec/dm2.

* * * * *